US006979388B2

(12) United States Patent
Marinero et al.

(10) Patent No.: US 6,979,388 B2
(45) Date of Patent: Dec. 27, 2005

(54) MAGNETIC THIN FILM DISKS WITH A NONUNIFORM COMPOSITION

(75) Inventors: Ernesto E. Marinero, Saratoga, CA (US); Timothy Martin Reith, San Jose, CA (US); Hal Jerves Rosen, Los Gatos, CA (US); Brian R. York, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 26 days.

(21) Appl. No.: 10/758,932

(22) Filed: Jan. 16, 2004

(65) Prior Publication Data

US 2004/0146748 A1 Jul. 29, 2004

Related U.S. Application Data

(62) Division of application No. 09/955,911, filed on Sep. 18, 2001, now Pat. No. 6,709,774.

(51) Int. Cl.⁷ .............................................. C23C 14/34
(52) U.S. Cl. .............................. 204/192.3; 204/192.2; 204/192.15
(58) Field of Search ................... 204/192.12, 192.15, 204/192.2, 192.3

(56) References Cited

U.S. PATENT DOCUMENTS

| | | | |
|---|---|---|---|
| 4,259,392 A | 3/1981 | Suzuki | 428/212 |
| 4,588,653 A | 5/1986 | Wray | 428/600 |
| 4,626,336 A | 12/1986 | Bloomquist et al. | 204/298 |
| 4,663,009 A | 5/1987 | Bloomquist et al. | 204/192.2 |
| 4,834,855 A | 5/1989 | Bloomquist et al. | 204/192.15 |
| 5,084,152 A | 1/1992 | Lin | 204/192.15 |
| 5,304,878 A | 4/1994 | Oda et al. | 310/673 |
| 5,324,593 A | 6/1994 | Lal et al. | 428/610 |
| 5,352,501 A | 10/1994 | Miyamoto et al. | 428/64 |
| 5,356,522 A | 10/1994 | Lal et al. | 204/192.15 |
| 5,432,012 A | 7/1995 | Lal et al. | 428/610 |
| 5,434,104 A * | 7/1995 | Cain et al. | 438/652 |
| 5,492,745 A | 2/1996 | Yokoyama | 428/65.3 |
| 5,494,722 A | 2/1996 | Oka et al. | 428/65.3 |
| 5,496,632 A | 3/1996 | Yamaguchi et al. | 428/332 |
| 5,520,981 A | 5/1996 | Yang et al. | 428/65.5 |
| 5,523,173 A | 6/1996 | Doerner et al. | 428/611 |
| 5,626,970 A | 5/1997 | Hedgcoth | 428/611 |
| 5,650,889 A | 7/1997 | Yamamoto et al. | 360/97.01 |
| 5,693,197 A | 12/1997 | Lal et al. | 204/192.2 |
| 5,725,739 A | 3/1998 | Hu | 204/192.3 |
| 5,750,230 A | 5/1998 | Ishikawa | 428/65.3 |
| 5,891,311 A | 4/1999 | Lewis et al. | 204/192.12 |

FOREIGN PATENT DOCUMENTS

JP 62092847 A1 10/1988 .......... G11B 11/20

OTHER PUBLICATIONS

Cuomo, Gambino and Rosenberg, "The influence of bias on the deposition of metallic films in rf and dc sputtering", J. Vac. Sci. Technology, vol. 11, No. 1, Jan./Feb. 1974, XP002218313, pp. 34-40.
A. Moje, European Patent Office, International Search Report for related application PCT/GB 02/03800.
N. Tani, "Increase of Coercive Force in Sputtered Hard Disk", IEEE Transactions on Magnetics, vol. 26, No. 4, Jul. 1990, pp. 1282ff.
J. Pressesky, et al., "Crystallography and Magnetic Properties of CoCrTa Films Prepared on Cr Underlayers with Different Substrate Bias Conditions", J. Appl. Physics 69(8). Apr. 15, 1991.
H. Murata, et al., "Magnetic Properties and Microstructure of CoCrTa/Cr Magnetic Recording Media", Magnetic & Electronic Materials Research Laboratory, Hitachi Metals, Ltd.; vol. 16, No. 3, 1992, pp. 541ff.
S. Parkin, "The magic of magnetic multilayers"; IBM Journal of Research & Development; vol. 42, No. 1, 0018-8646/98, Jan. 26, 1998.
S. Rossnagel, "Sputter deposition for semiconductor manufacturing"; IBM Journal of Research & Development; vol. 43, No. 1, Mar. 20, 1998.
M. Datta, "Applications of electrochemical microfabrication: An Introduction"; IBM Journal of Research & Development; vol. 42, No. 5, 0018-8646/98, Jun. 25, 1998.
D.W. Hoffman, "Intrinsic Re-sputtering—Theory and Experiment", J. Vac. Sci. Technology, A8(5), 3707, Sep.-Oct. 1990.

* cited by examiner

*Primary Examiner*—Steven Versteeg
(74) *Attorney, Agent, or Firm*—G. Marlin Knight

(57) ABSTRACT

A method of influencing variations in composition of thin films is described. The elemental plasma field distribution in sputtering systems is manipulated by generating a nonuniform electric field along a surface of the substrate to alter the composition by differentially re-sputtering the target elements. The nonuniform electric field is used to modulate the kinetic energy of the ions generated in the plasma which strike the thin film's surface. By applying varying electric potentials at a plurality of points on a conductive surface of a substrate, the electric field across the surface of the substrate can be modulated in a variety of patterns. In the preferred embodiment a radial voltage gradient is applied to a conductive surface of a disk on which a magnetic thin film is being formed to radially modulate the platinum content of the magnetic film.

22 Claims, 7 Drawing Sheets

MAGNETIC THIN FILM DISKS WITH A NONUNIFORM COMPOSITION

This application is a Divisional application of U.S. application Ser. No. 09/955,911 filed Sep. 18, 2001, now U.S. Pat. No. 6,709,774.

FIELD OF THE INVENTION

The invention relates to magnetic thin film disks and methods for their fabrication and more particularly to magnetic thin film media having nonuniform magnetic properties due to nonuniform composition and methods for creating the nonuniform composition.

BACKGROUND OF THE INVENTION

A typical prior art head and disk system 10 is illustrated in FIG. 1. In operation the magnetic transducer 20 is supported by the suspension 13 as it flies above the disk 16. The magnetic transducer 20, usually called a "head" or "slider," is composed of elements that perform the task of writing magnetic transitions (the write head 23) and reading the magnetic transitions (the read head 12). The electrical signals to and from the read and write heads 12, 23 travel along conductive paths (leads) which are attached to or embedded in the suspension 13. Typically there are two electrical contact pads (not shown) each for the read and write heads 12, 23. Wires or leads 14A, 14B, 15A, 15B are connected to these pads and routed in the arm 13 to the arm electronics (not shown). The magnetic transducer 20 is positioned over points at varying radial distances from the center of the disk 16 to read and write circular tracks (not shown). The disk 16 is attached to a spindle 18 that is driven by a spindle motor 24 to rotate the disk 16. The disk 16 comprises a substrate 26 on which a plurality of thin films 21 are deposited. The thin films 21 include ferromagnetic materials in which the write head 23 records the magnetic transitions in which information is encoded.

FIG. 2 illustrates a section of a prior art disk 16. The conventional substrate 26 is a conductive disk of AlMg with an electroless coating of NiP which has been highly polished. The thin films 21 on the disk 16 conventionally include a chromium or chromium alloy underlayer (s) 31 which is deposited on the substrate 26. The recording layer (s) 33 is (are) based on various alloys of cobalt, nickel and iron. For example, a commonly used alloy is CoPtCr. Additional elements such as tantalum and boron are often used to magnetically isolate the grains. A protective overcoat layer 35 is used to improve wearability and corrosion. While instructive, the three film disk described above does not exhaust the possibilities. Various seed layers (not shown), multiple underlayers (not shown) and laminated magnetic films (not shown) have all been described in the prior art. In addition, other materials besides AlMg are utilized as substrates.

When a magnetic disk 16 is designed for a future disk drive 10, a target coercivity range is determined based on the overall system requirements. For example, an upper limit on the coercivity is set by the write head's 23 ability to induce transitions in the magnetic film 33. Therefore, part of the disk designer's task is to obtain a specific coercivity range rather than the highest possible coercivity. One method of adjusting the coercivity follows from the fact that the platinum content of the magnetic film 33 is known to directly affect the film coercivity. Within limits, a marginal change in the platinum content will directly affect the coercivity by a predictable amount. The composition of the magnetic film 33 mirrors the composition of the sputtering target to a good level of accuracy, so a marginal increase in the platinum content in sputtering target is reflected in the deposited film.

At a macro level it is desirable for the coercivity of the magnetic film 33 to be fairly uniform both radially and circumferentially. However, there are factors at work in a disk drive which may make it desirable to have subtle radial gradients in the coercivity. For example, at constant rotation speed, the flying height of the transducer 20 above the disk 16 may vary from the inner diameter (ID) to the outer diameter (OD) of the disk 16. The flying height directly affects the field strength generated by the write head 23 in the magnetic film 33. The linear velocity (for constant rpm) is higher at the OD than the ID. This implies that the head flies higher at the OD as compared to the ID. This presents a writability problem at the OD.

Films are grown by sputtering from alloy targets whose compositions are optimized to provide the desired magnetic properties. The target material is held at a negative voltage to provide acceleration for the positively charged sputter gas ions (typically Ar). The ground potential for this arrangement is normally the chamber walls. The substrate is not grounded. Current-art sputtering systems used for fabricating magnetic disks 16 provide also the capability of providing negative or positive bias to the disk substrate. The voltage used is typically on the order of −300 volts.

SUMMARY OF THE INVENTION

A method of influencing variations in composition of thin films is described. The elemental plasma field distribution in sputtering systems is manipulated by generating a nonuniform electric field along a surface of the substrate to alter the composition by differentially re-sputtering the target elements. The nonuniform electric field is applied by one or more electrodes in contact with a conductive surface or by using an RF bias signal. The nonuniform electric field is used to modulate the kinetic energy of the ions generated in the plasma which strike the thin film's surface. Since the kinetic energy and the mass of the sputtering gas ions and neutrals affect the re-sputtering rate, the nonuniform electric field differentially affects the elements being deposited according to mass. By applying varying electric potentials at a plurality of points on a conductive surface of a substrate, the electric field across the surface of the substrate can be modulated in a variety of patterns. For example, the field can be varied along the circumferential and/or radial direction of a disk. In the preferred embodiment a radial voltage gradient is applied to a conductive surface of a disk on which a magnetic thin film is being formed to radially modulate the platinum content of the magnetic film. Modulating the radial platinum content in turn modulates the radial coercivity.

DETAILED DESCRIPTION OF THE INVENTION AND THE PREFERRED EMBODIMENTS

Figure 1:
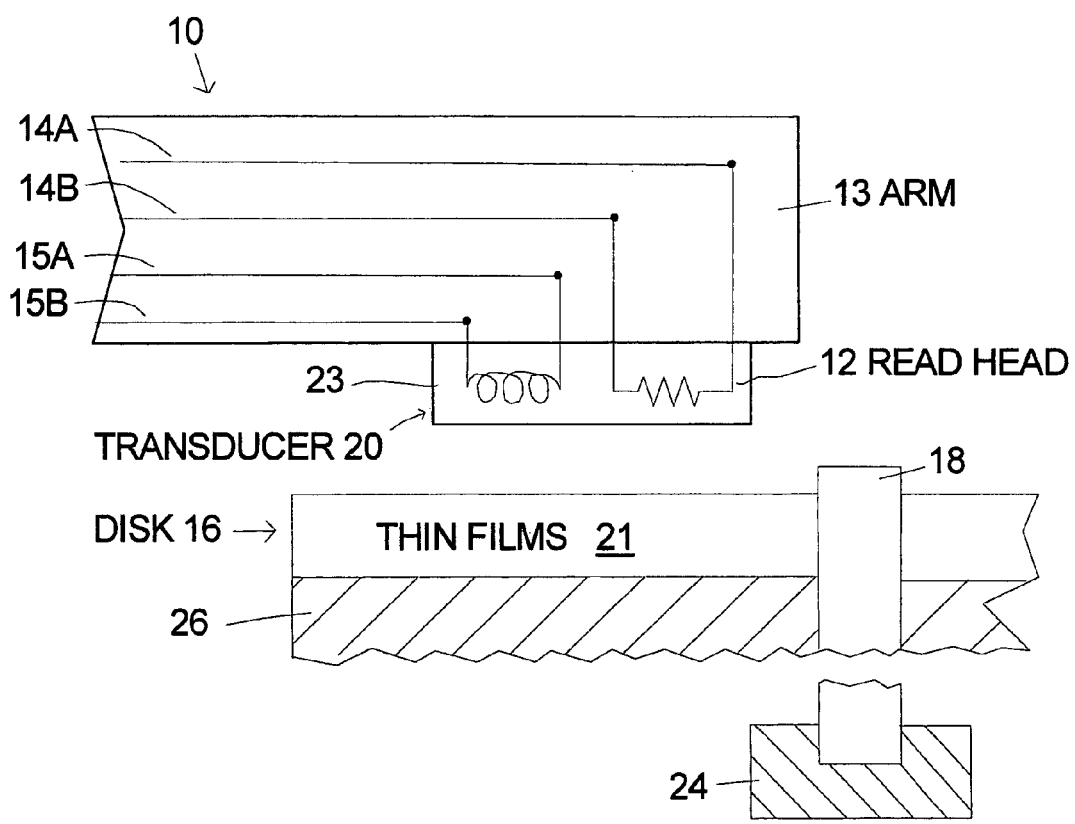
FIG. 1 is a symbolic illustration of the prior art showing the relationships between the head and associated components in a disk drive.
Figure 2:
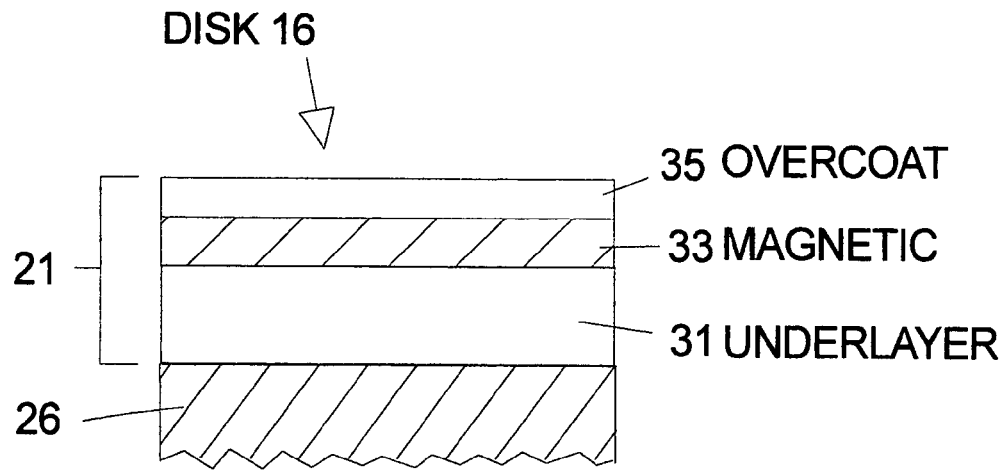
FIG. 2 is an illustration of one type of prior art layer structure for a magnetic thin film disk.
Figure 3:
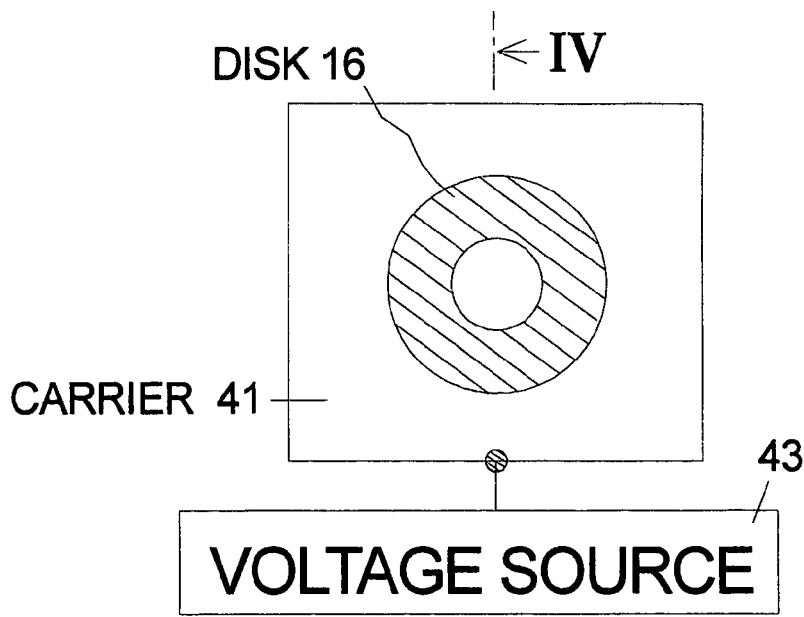
FIG. 3 is an illustration of a mechanical setup for applying bias to a disk substrate during sputtering.

FIG. 3 is an illustration of one method of applying a voltage bias to a disk 16 while the thin films are being sputtered. The disk 16 is mechanically supported by a conductive carrier 41 which is connected to a voltage source 43. The voltage range of the voltage source 43 should be approximately −150 to −600 v. Typically both sides of the disk 16 are used so the carrier 41 needs to be designed to support the disk 16 without obscuring any more of either surface than is necessary. There are clearly numerous ways to achieve this and the details are outside of the scope of the invention. For the purpose of describing the preferred embodiment of the invention, it is only necessary to have the disk 16 in contact with an electric conductor in a substantially continuous way around the outer circumference or alternatively around the inner diameter. The carrier 41 can be a large movable rack with supports for many disks 16 which can travel through a pass through sputtering system or it can be a designed for stationary support of a single disk 16.

Figure 4:
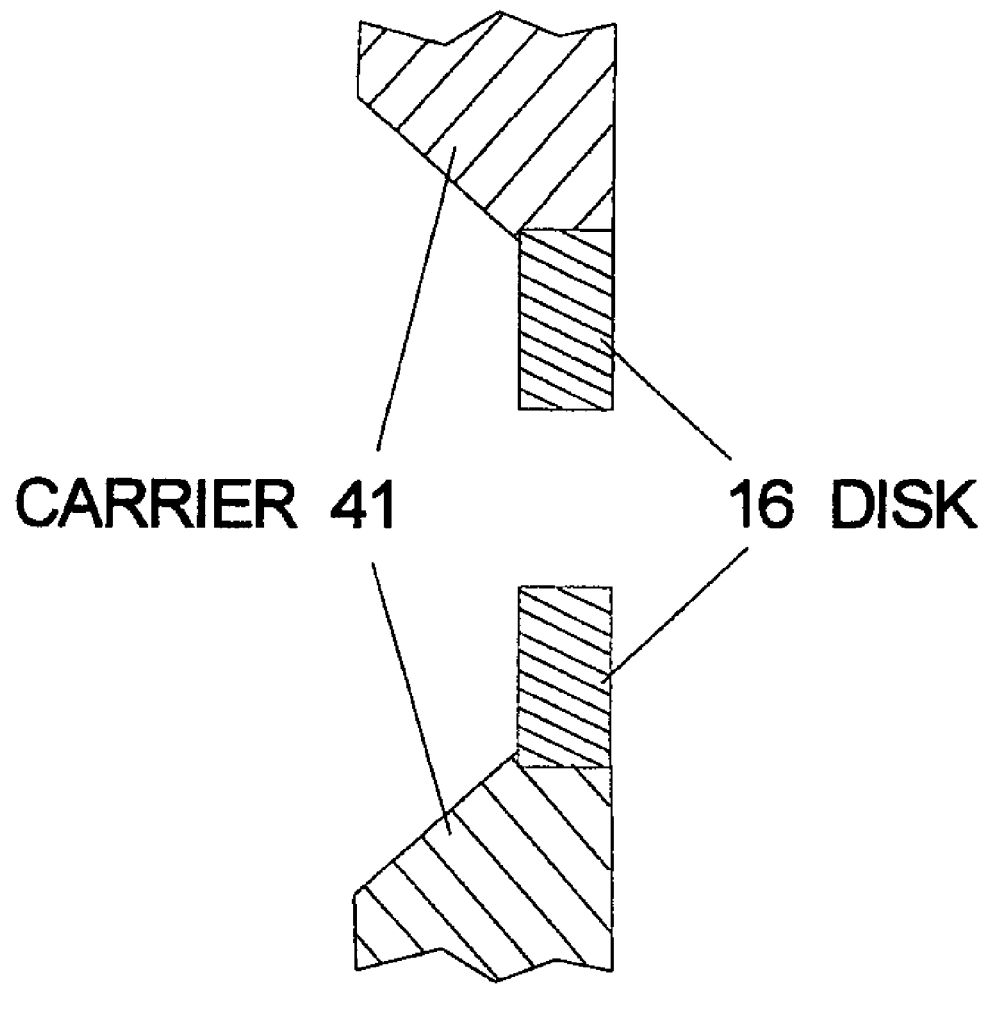
FIG. 4 is an illustration of a midline section view of the carrier and disk shown in FIG. 3 along the line marked IV.

FIG. 4 is a midline section view of the disk 16 and carrier 41 of FIG. 3 along line IV. This section shows that carrier 41 supports disk 16 by a narrow lip 42 which extends around the entire circumference of the hole in carrier 41 which supports the disk 16. This arrangement leaves substantially all of both sides of disk 16 exposed for sputtering. More importantly, however, because the outer circumference of the disk 16 is continuously in contact with the conductive carrier 41 the electric field which results from the negative bias voltage is uniform around the circumference of the disk 16.

Figure 5:
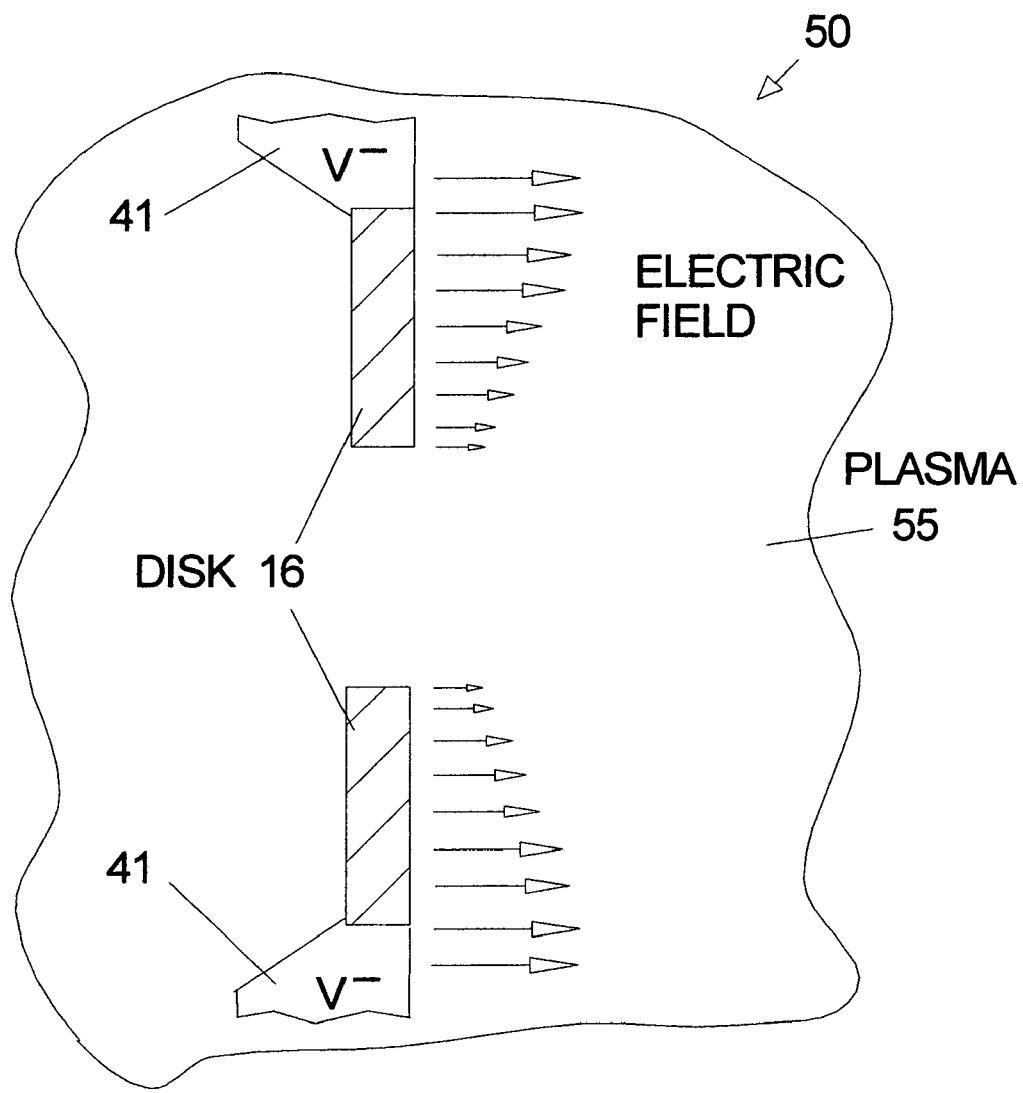
FIG. 5 is an illustration of an electric field gradient along the midline section of the disk and carrier in the sputtering chamber according to the invention.

FIG. 5 is the same midline section of FIG. 4, but in this drawing the disk 16 and carrier 41 are illustrated in the sputtering chamber 50 which contains plasma 55 which contains the sputtering gas ions and the target sputtered elements. In the case where a CoCrPt magnetic film is being deposited using argon as the working gas, the plasma would contain positive ions and neutrals of the sputtering gas as well as neutral and charged Co, Pt and Cr species. The electric field generated around the disk 16 is illustrated by the arrows which are arranged perpendicular the disk's planar surface. Only one side of the disk 16 is decorated with the arrows in order to simplify the illustration and provid room for the element numbers and labels, but the field on the undecorated side is symmetric with what is shown. The size of the arrow indicates the strength of the electric field relative to a selected baseline. In absolute terms the variation in the electric field is small, but nevertheless significant. The electric field is shown as being strongest at the circumference of the disk 16 and monotonically declining to the lowest value at the inner diameter.

One effect of the electric field is accelerate the positive ions in the plasma 55 toward the disk 16. In the absence of the electric field bias, positive ions are only accelerated towards the target material. Application of negative bias to the substrate results in positive ion bombardment of the growing thin film surface. The predominant impinging species on the growing thin film surface are positively charged Ar ions. This results in re-sputtering effects and since the field is stronger at the outer diameter, the acceleration will be correspondingly greater at the outer diameter. Re-sputtering effects during film growth have been discussed by D. W. Hoffman, "Intrinsic Re-sputtering—Theory and Experiment", (J. Vac. Sci. Tech. A(8), 3707, (1990)). The intrinsic re-sputtering efficiency was found to strongly depend on the mass ratios of the target material (Mt) and the sputtering gas (Mg) and shows mostly a linear dependence on the following dimensionless parameter: (Mt−Mg)/(Mt+Mg). Experimentally it is found that Ar ions (mass=40 amu) re-sputter Pt (195 amu) more effectively than Co (59 amu) or Cr (52 amu). The re-sputtering efficiency is also found by Hoffman to depend on the energy of the sputtering ion. This is provided by the substrate bias and as discussed it is largest at the outer diameter (OD) in the embodiment being described. Therefore, it is expected that platinum will be re-sputtered more effectively by the ionized sputtering Ar+ gas where the electric field is greater. This differential re-sputtering will lead to a reduced platinum content where the electric field is greatest. Since the electric field in the carrier example above, declines along the radius of the disk 16, the platinum content is predicted to increase along radial lines from the outer diameter (circumference) and the inner diameter.

Figure 6:
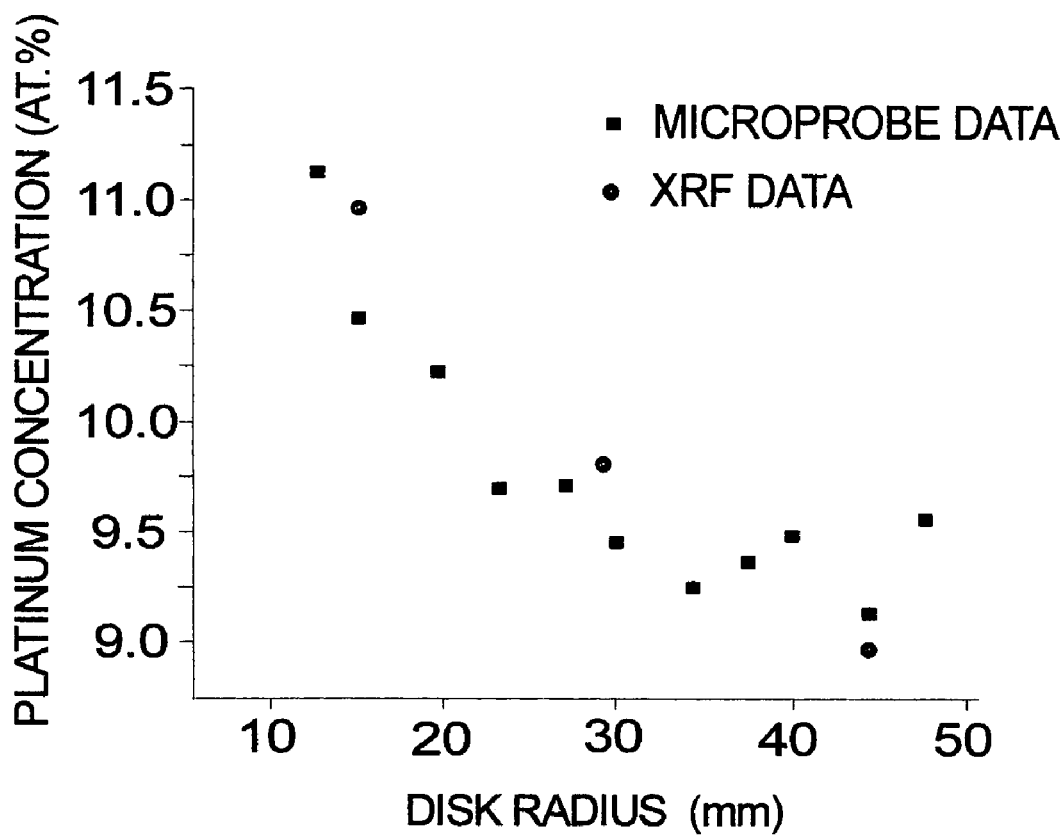
FIG. 6 is a plot of experimental data showing the platinum content of a disk according to the invention plotted by radial distance.
Figure 7:
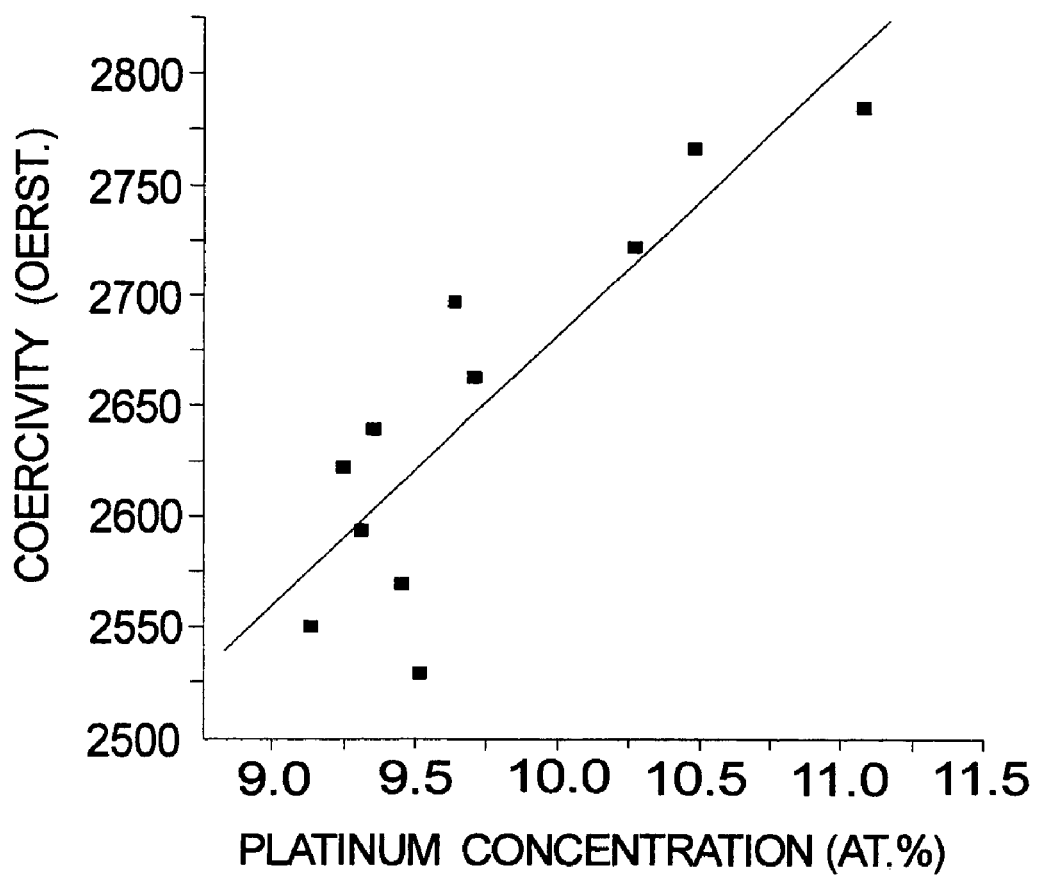
FIG. 7 is a plot of the experimental data showing the coercivity (Hc) versus the platinum content for the disk of FIG. 6.

Experimental data of the platinum content of a sputtered disk 16 plotted by radial distance is given in FIG. 6. The disk 16 was supported in the method shown for carrier 41 in a multidisk pass through sputtering system such as those commercially available from the Ulvac company. The substrate 26 was AlMg with a NiP coating. The underlayer was CrV. The magnetic film and the targets were CoPtCrTa; The bias voltage was about −300 v. The platinum content was measured by microprobe (the squares on the graph) and XRF (the circles). Each method confirmed the clear trend of increasing platinum content from the outer circumference to the inner diameter. The total increase in the platinum content along a 35 mm radial line was approximately 2 at. %, i.e. from about 9 to 11 at. %. The slope of the platinum content could be expected to reverse if the voltage source is shifted to the inner diameter of the disk FIG. 7 is a plot of the coercivity (Hc) versus the platinum content for the same disk of FIG. 6. For the 2 at. % increase of platinum content the data show an increase of Hc from about 2550 Oe to 2800 Oe as confirmation of the relationship between coercivity and platinum content.

The method of varying the electric field distribution across the surface of the disk is not limited to linearly increasing or decreasing fields. Special bias contacts and geometries across the surface of the disk can be used to produce different bands and/or sectors with varying compositional properties. For example, a concentric array of bias contacts each of which is held at a selected potential can be brought into contact with the substrate to modulate the electric field distribution across the disk surface. In the embodiment described in detail above results in modulation of the electric field along radial lines; however, using an array of bias contacts would allow the modulation to occur circumferentially as well. Variations of such an approach could allow servo islands or sectors with large modulations of coercivity to be distributed circumferentially. Patterned media for use in disk drives have also been proposed as a way of decreasing the track width. Using the method of the invention patterned magnetic media could be produced by tailoring the electric field distribution across the surface of the disk.

Figure 8:
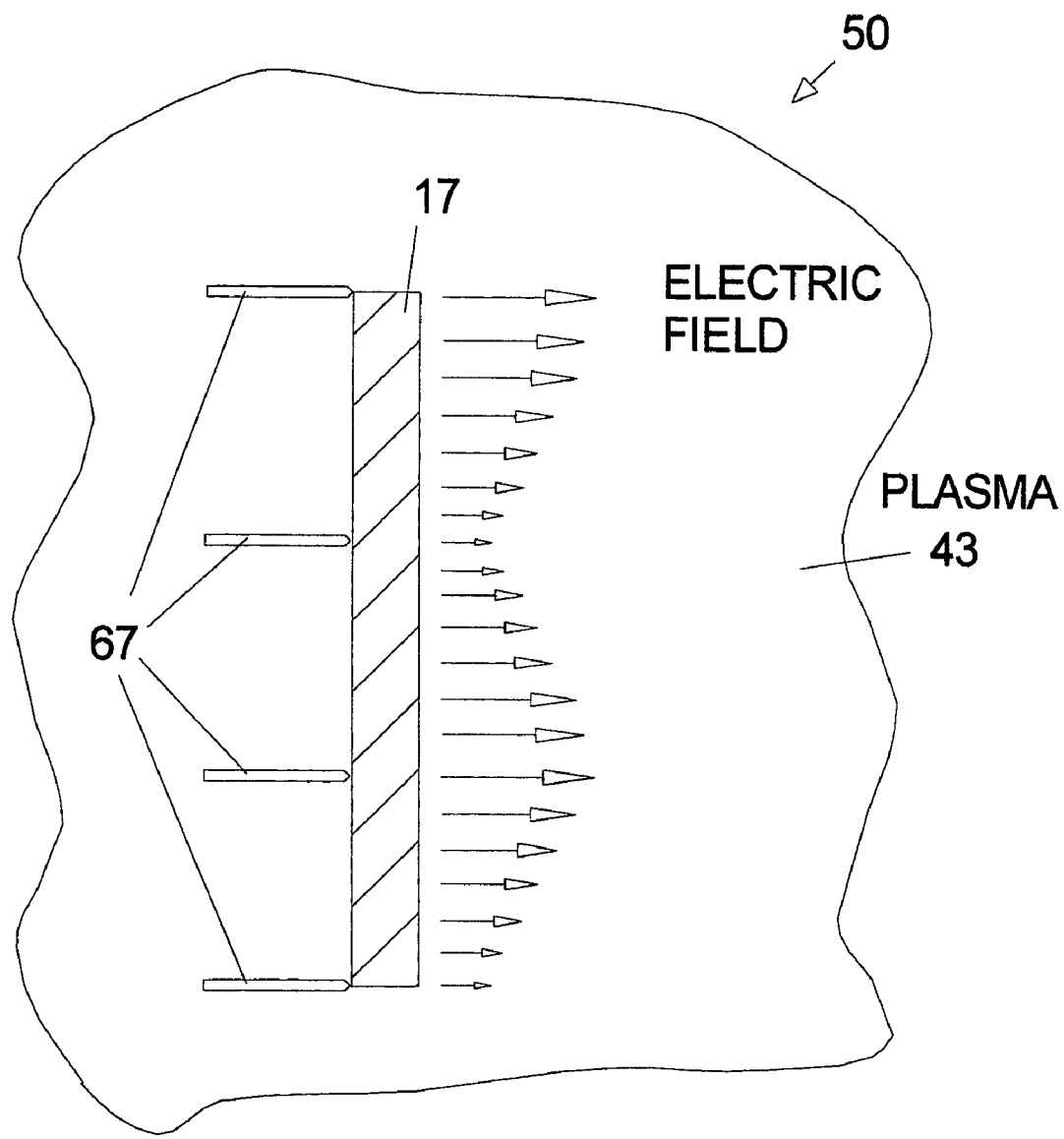
FIG. 8 is an illustration of a nonuniform electric field along the midline section of a substrate applied with a plurality of electrodes according to the invention.

FIG. 8 is an illustration of a nonuniform electric field along the midline section of a substrate 17 applied with a plurality of electrodes 67 according to the invention. The previous illustration used a single electrode which was also the carrier. These two function need not be provided by the same member. The electrodes 67 in FIG. 8 contact the substrate 17 on one surface and generate the electric field on the opposite surface where the deposition is occurring. The electrodes 67 are shown as point contact elements, but can be any shape. The electrodes 67 can be connected to independent power sources to allow each one to have a potential independent of the other electrodes and, therefore, to allow maximum flexibility in tailoring the variations in the electric field for the particular application. The electrodes 67 of the embodiment of FIG. 8 can also be arranged in any x-y pattern in the plane of the substrate.

In any application of the invention the substrate is not required to be conductive except for the surface. Thus, nonmetallic materials such as glass may be used with the method of the invention if a layer of conductive material is applied to the surface. The conductive layer may be sputtered or deposited by other means. If the bias is applied using an RF signal, there is no need for the surface to be conductive.

It is well known in the sputtering art that variations in sputtering systems make it difficult to make quantitative predictions; therefore, the experimental data given above should be used for qualitative understanding of the technique.

The ability to affect the composition of a thin film according to the mass of the elements by an applied electric field can conceptually be applied to nonmagnetic films and to nondisk-shaped substrates. If the electric field can be varied over distance or time and the masses of the elements are sufficiently different, the technique of the invention may be employed.

What is claimed is:

1. A method of sputtering a thin film comprising the steps of:
    installing a target containing first and second elements in a sputtering chamber, the first element having a higher atomic weight than the second element;
    placing a substrate with a conductive surface in electric contact with at least a first electrode;
    generating a plasma containing positive ions of first and second elements; and
    differentially re-sputtering the first element by applying a first electric potential to the first electrode to form a nonuniform electric field along the conductive surface to deposit the thin film with variations in an atomic percentage of the first element along the conductive surface.

2. The method of claim 1 wherein the substrate is a disk having a central hole and the first electrode contacts the conductive surface at an outer diameter and the nonuniform electric field varies monotonically along radial lines on the conductive surface of the disk.

3. The method of claim 2 wherein the thin film is magnetic and has a coercivity gradient along radial lines on the disk.

4. The method of claim 3 wherein the coercivity is lowest at a circumference of the disk.

5. The method of claim 1 wherein the first element is platinum, the second element is cobalt and the substrate is a disk.

6. The method of claim 5 wherein the first electrode contacts the disk around a circumference of the disk.

7. The method claim 6 wherein the nonuniform electric field varies according to radial position on the disk and the variation in the atomic percentage of platinum is along radial lines on the disk.

8. The method of claim 7 wherein the atomic percentage of platinum is lowest at the circumference of the disk.

9. The method claim 1 further comprising the steps of placing the conductive surface in electric contact with a second electrode; and applying a second electric potential to the second electrode, the second electric potential being different from the first electric potential.

10. The method claim 9 further comprising the steps of placing the conductive surface in electric contact with a third electrode; and applying a third electric potential to the third electrode, the third electric potential being different from the first and second electric potentials.

11. The method claim 1 further comprising the steps of placing the conductive surface in electric contact with a plurality of electrodes arranged in a pattern and applying nonuniform electric potentials to the plurality of electrodes to modulate the electric field distribution across the disk surface to produce a pattern in the variations in an atomic percentage of the first element along the conductive surface.

12. The method claim 11 wherein the plurality of electrodes are arranged in a concentric array.

13. The method claim 11 wherein the atomic percentage of the first element varies circumferentially.

14. The method claim 13 wherein the variations in an atomic percentage of the first element form servo islands which are distributed circumferentially.

15. A method of sputtering a thin film comprising the steps of:
    installing a target containing first and second elements in a sputtering chamber, the first element having a higher atomic weight than the second element;
    generating a plasma containing positive ions of first and second elements; and
    placing a substrate in electric contact with at least a first electrode;
    differentially re-sputtering the first element by applying a RF electric potential to the first electrode to form a nonuniform electric field along a surface of the substrate to deposit the thin film with variations in an atomic percentage of the first element along the surface.

16. The method of claim 15 wherein the first element is platinum, the second element is cobalt and the substrate is a disk.

17. The method claim 16 wherein the nonuniform electric field varies according to radial position on the disk and the variation in the atomic percentage of platinum is along radial lines on the disk.

18. The method of claim 16 wherein the thin film is magnetic and has a coercivity gradient along radial lines on the disk.

19. The method of claim 16 wherein the substrate is a disk, the nonuniform electric field varies along radial lines on the disk, the variation in the atomic percentage of the first element is along the radial lines, the thin film is magnetic and has a variation in coercivity corresponding to the variation in the atomic percentage of the first element.

20. The method of claim 15 wherein the substrate is a disk and the atomic percentage of the first element is equal in concentric bands on the disk forming a pattern.

21. The method of claim 15 wherein the substrate is a disk and the atomic percentage of the first element varies circumferentially.

22. The method of claim 15 wherein the substrate is a disk, the thin film is magnetic and the variations in an atomic percentage of the first element form servo islands which are distributed circumferentially.

* * * * *